United States Patent [19]

Spiliotis

[11] 4,175,011

[45] Nov. 20, 1979

[54] SULFATE-FREE METHOD OF ETCHING COPPER PATTERN ON PRINTED CIRCUIT BOARDS

[75] Inventor: Nicholas J. Spiliotis, Parsippany, N.J.

[73] Assignee: Allied Chemical Corporation, Morristown, N.J.

[21] Appl. No.: 925,085

[22] Filed: Jul. 17, 1978

[51] Int. Cl.² .......................... C25D 5/02; C23F 1/02; C09K 13/08
[52] U.S. Cl. ...................................... 204/15; 156/66; 252/79.3
[58] Field of Search ................ 204/15, 43 S; 156/659, 156/666; 252/79.2, 79.3

[56] References Cited

U.S. PATENT DOCUMENTS

| | | | |
|---|---|---|---|
| 3,181,984 | 5/1965 | Tillis | 156/664 |
| 3,293,093 | 12/1966 | Jones et al. | 156/666 |
| 3,554,878 | 1/1971 | Rothschild | 204/43 S |
| 3,677,949 | 7/1972 | Brindisi, Jr. et al. | 252/79.4 |
| 3,859,182 | 1/1975 | Vander Mey | 204/43 S |
| 3,864,271 | 2/1975 | Stalter | 252/99 |

*Primary Examiner*—T. M. Tufariello
*Attorney, Agent, or Firm*—Alan M. Doernberg; Jay P. Friedenson

[57] ABSTRACT

In printed circuit board manufacture, a copper pattern on the board is slightly etched and then a tin/lead layer is plated onto the etched copper pattern. The etching step is free of sulfate materials and includes etching the copper pattern with an aqueous solution of hydrogen peroxide and fluoboric acid.

5 Claims, No Drawings

SULFATE-FREE METHOD OF ETCHING COPPER PATTERN ON PRINTED CIRCUIT BOARDS

BACKGROUND OF THE INVENTION

It is conventional in the manufacture of printed circuit boards to deposit a pattern of copper as a conductor onto the board, generally by an electroless process or a mixture of electroless and electrolytic processes, then to etch the copper pattern slightly to prepare it for electrolytic plating of tin/lead and then to plate a tin/lead layer onto the etched copper pattern. The term "tin/lead" is generally understood as mixtures of the metals either in a plating solution or plated onto a surface. At present, there are three etching systems used to etch the copper pattern prior to tin/lead plating: mixtures of sulfuric acid and hydrogen peroxide, mixtures of chromic and sulfuric acids and ammonium persulfate mixed with water or sulfuric acid or both. An exemplary process involves plating with copper, rinsing with water, etching with ammonium persulfate and sulfuric acid (or another of the above etchants) for about one to two minutes, rinsing with water, dipping in a 5% aqueous sulfuric acid solution, rinsing with water, dipping in a 10% fluoboric acid solution, rinsing with water and plating in a tin-lead bath. A recurring problem in such systems is that any sulfate remaining on the copper pattern when it enters the tin-lead bath causes poor adhesion of the tin-lead deposit on the copper pattern. If in subsequent processing, the deposit is either melted or reflowed, dewetting of the tin-lead layer will incur and an inferior printed circuit board will result.

Fluoboric acid is a known material for various steps in the processing of printed circuit boards, particularly as a dip step after the etching or as a component in the electrolytic plating bath. Fluoboric acid has not, however, been used previously as a component of the main copper etch, and, in fact, copper is virtually inert to fluoboric acid by itself under normal etching conditions.

BRIEF DESCRIPTION OF THE INVENTION

The present invention includes an improvement in a method of forming printed circuit boards of the type wherein a copper pattern on the board is etched and then a tin/lead layer is plated onto the etched copper pattern. In the improvement, the etching step is free of sulfate materials and includes etching the copper pattern with an etchant comprising between about 0.5 and about 70 weight % hydrogen peroxide, between about 2 and about 90 weight % fluoboric acid and between about 5 and about 85 weight % water. Such a step eliminates the problem of sulfate contamination resulting in poor adhesion of the tin/lead layer onto the etched copper pattern.

DETAILED DESCRIPTION OF THE INVENTION

The etching step of the present invention may be practiced as a part of any conventional method of forming printed circuit boards of the type wherein a copper pattern on the board is etched and then a tin/lead layer is plated onto the etched copper pattern. Thus, it is not critical to the present invention how the copper pattern is placed on the board, although it is preferred that the copper pattern not contain sulfate contamination remaining from such a step. It is also not critical how the tin/lead layer is plated onto the copper pattern, with methods such as that described in U.S. Pat. No. 3,554,878 being suitable. It should be appreciated, however, that since lead forms insoluble salts in the presence of sulfate, any tin/lead plating bath will be free of sulfate contamination.

The specific etching conditions used to etch the copper pattern are not critical, but rather can be easily determined for a particular piece of equipment, a particular etching composition and acceptable etching rates. Such etching is conveniently conducted at room temperature, although higher and lower etching temperatures are permissable. Etching is conveniently conducted without agitation, although agitation is also permissable. Both manual and automatic processes are contemplated.

The present invention contemplates an aqueous etchant composition comprising between about 0.5 and about 70% hydrogen peroxide, between about 2 and about 90% fluoboric acid and between about 5 and about 85% water, all by weight. Sufficient water is generally included in the system by virtue of the use of aqueous solutions of both hydrogen peroxide and fluoboric acid to prepare the etchant. Thus when one may start with hydrogen peroxide solutions of different strengths, with more concentrated solutions such as 30% nominal, 50% nominal and the like being preferred. The use of dilute hydrogen peroxide solutions, such as below about 2%, is less preferred because of the difficulty in providing sufficient hydrogen peroxide to the etchant. Fluoboric acid is available in highly concentrated solutions such as, for example, a 50% fluoboric acid solution from Specialty Chemicals Division of Allied Chemical Corporation. While a broad range of 0.5 to about 70% peroxide and about 2.5 to about 90% fluoboric acid is acceptable, preferred ranges are about 2 to about 15% hydrogen peroxide and about 25 to about 50% fluoboric acid. Most preferred is about 3 to about 7% peroxide and about 35 to about 45% fluoboric acid. Etchant compositions within the preferred range generally offer etch rates equivalent to ammonium persulfate and hence can be used in existing processes and/or machines with a minimum of adjustment.

In using the present etchants, one may conduct the entire process in a manner similar to conventional processes, following the etched step by a water rinse, a dip in fluoboric acid, another water rinse and a plating step. The sulfuric acid dip and water rinse are thereby eliminated. Since, however, the fluoboric acid is present in the etchant, one may go directly from the etch step to the plating step with only a single water rinse. It is preferred, however, to follow the water rinse with a dip in aqueous fluoboric acid (such as a 10% solution). One thereby eliminates both the sulfuric acid dip and the fluoboric acid dip of conventional processes, cutting the complexity of the entire process down considerably. In such processes, tin/lead fluoborate plating baths are preferred.

The present invention is illustrated by the following examples, which are intended only as illustration and not to limit the invention within the broad scope of the claims.

EXAMPLE 1

Preparation of Copper Panels

Copper panels 2½ inches by 4 inches were scoured with a commercial cleanser, rinsed with water, degreased in ENDBOND 160 (an alkali cleaner from Ethone, Inc. of New Haven, Connecticut) for 10 minutes, rinsed, pickled with 4 parts of a 50% $HBF_4$ solution and 1 part of a nominal 30% $H_2O_2$ solution at room temperature for one minute and then rinsed. These panels were then dried by dipping for 15 seconds in absolute alcohol, dipping for 15 seconds in a drying solvent of 85 weight percent trichlorotrifluoroethane and 15 weight percent isopropanol and then blowing dry with clean air. Each panel was then weighed on an analytical balance before etching.

EXAMPLE 2

A mixture was made of 900 milliliters of a 50 weight percent fluoboric acid solution (the remainder water) and 981 milliliters of a nominal 30 weight percent hydrogen peroxide solution (determined by titration with potassium permanganate to actually contain about 27.4 weight percent hydrogen peroxide). Accordingly, this mixture contained about 26.8 weight percent fluoboric acid and about 12.7 weight percent hydrogen peroxide.

Five boards from Example 1 were etched with the above mixture for 1, 2, 3, 4 and 5 minutes. Each board was then rinsed with water and redipped in methanol and then a fluorocarbon drying solvent and then blown dry with air and reweighed on an analytical balance. All weights were made to the second tenth of a milligram. The weight loss (in grams) for each board has been calculated from the surface area to arrive at the number of mils (thousandths of an inch) lost.

EXAMPLE 3

Example 2 was repeated with a mixture of 1350 mls of 50% $HBF_4$ and and 491 mls of 27.4% $H_2O_2$, the mixture thus having, by weight, 38.8% $HBF_4$, 6.2% $H_2O_2$ and the balance water. The etch levels in mils are shown in Table 1.

EXAMPLE 4

Example 2 was repeated with a mixture of 1500 mls of 50% $HBF_4$ and and 327 mls of 27.4% $H_2O_2$, the mixture thus having, by weight, 42.6% $HBF_4$, 4.1% $H_2O_2$ and the balance water. The etch levels in mils are shown in Table 1.

EXAMPLE 5

Example 2 was repeated with a mixture of 1575 mls of 50% $HBF_4$ and and 245 mls of 27.4% $H_2O_2$, the mixture thus having, by weight, 44.5% $HBF_4$, 3.0% $H_2O_2$ and the balance water. The etch levels in mils are shown in Table 1.

EXAMPLE 6

Example 2 was repeated with a mixture of 1620 mls of 50% $HBF_4$ and and 196 mls of 27.4% $H_2O_2$, the mixture thus having, by weight, 45.6% $HBF_4$, 2.4% $H_2O_2$ and the balance water. The etch levels in mils are shown in Table 1.

It can be seen from Examples 2–6 that reasonable etch rates are achieved from mixtures of aqueous fluoroboric acid and between 2 and about 13 weight % hydrogen peroxide. From these tests, it is concluded that the preferred range of about 20–50% fluoboric acid and about 2–15% hydrogen peroxide would yield similar results. Satisfactory etch rates would also be expected in the broad range of 0.5–70% peroxide and 2.5–90% fluoboric acid. Based upon desired specific etch rates, the more preferred range of about 3–7% peroxide and about 35–45% peroxide has been selected.

EXAMPLE 7

Example 2 was repeated with a mixture of 755 ml 50% $HFB_4$, 855 ml $Cu(BF_4)_2$ (equivalent to 160 grams copper) and 196 ml 27.8% $H_2O_2$, yielding a solution with, by weight, 36.8% $BF_4^-$ and 2.4% $H_2O_2$ and 32.0 g/l copper (as elemental copper). The etch levels are shown in Table 1.

EXAMPLE 8

Example 2 was repeated with a mixture of 1435 mls 50% $HBF_4$, 285 mls $Cu(BF_4)_2$ (equivalent to 50.3 grams copper) and 194 mls 27.8% $H_2O_2$, yielding a solution, by weight, of 42.7% $BF_4^-$ and 2.3% $H_2O_2$ and 10.1 g/l copper. The etch levels are shown in Table 1.

EXAMPLES 9 and 10

Examples 7 and 8 were repeated with the same solution except that 0.1 ml of concentrated HCl was added to each 360 ml sample of solution.

Examples 7 and 8 show that copper (as would be found in the etchant after use) inhibits the etch rate only somewhat. Examples 9 and 10 show that the etchant can be revived to at least initial activity by the addition of concentrated hydrochloric acid.

TABLE I

| EXAMPLE | Weight % $HBF_4$ | Weight % $H_2O_2$ | g/l copper added | mls HCl added/360 ml sample | Mils Etched (1000 mils - 1 inch) 1 min | 2 min | 3 min | 4 min | 5 min |
|---|---|---|---|---|---|---|---|---|---|
| 2 | 26.8 | 12.7 | — | — | 0.093 | 0.164 | 0.351 | 0.386 | 0.809 |
| 3 | 33.8 | 6.2 | — | — | 0.097 | 0.185 | 0.269 | 0.341 | 0.545 |
| 4 | 42.6 | 4.1 | — | — | 0.058 | 0.116 | 0.165 | 0.233 | 0.340 |
| 5 | 44.5 | 3.0 | — | — | 0.067 | 0.121 | 0.174 | 0.232 | 0.337 |
| 6 | 45.6 | 2.4 | — | — | 0.058 | 0.096 | 0.151 | 0.196 | 0.334 |
|   | Weight % *$BF_4$ | Weight % $H_2O_2$ |   |   |   |   |   |   |   |
| 7 | 36.8 | 2.4 | 32.0 | — | 0.048 | 0.086 | 0.137 | 0.189 | 0.242 |
| 8 | 42.7 | 2.3 | 10.1 | — | 0.048 | 0.097 | 0.135 | 0.178 | 0.231 |
| 9 | 36.8 | 2.4 | 32.0 | 0.1 ml | 0.062 | 0.130 | 0.217 | 0.299 | 0.438 |
| 10 | 42.7 | 2.3 | 10.1 | 0.1 ml | 0.074 | 0.154 | 0.244 | 0.344 | 0.464 |

*This is total $BF_4$ ion which includes the $BF_4$ from $HBF_4$ as well as $Cu(BF_4)_2$

What is claimed is:

1. In a method of forming printed circuit boards of a type wherein a copper pattern on a board is etched and then a tin/lead layer is plated onto the etched copper pattern, the improvement wherein the etching step consists essentially of contacting the surface with an aqueous etchant solution comprising between about 0.5 and about 70 weight % hydrogen peroxide, between about 2.5 and about 90 weight % fluoboric acid and between about 5 and about 85 weight % water.

2. The method of claim 1 wherein the aqueous etchant solution comprises between about 2 and about 15 weight % hydrogen peroxide and between about 20 and about 50 weight % fluoboric acid.

3. The method of claim 2 wherein the aqueous etchant soluton comprises between about 3 and about 7 weight % hydrogen peroxide and between about 35 and about 45 weight % fluoboric acid.

4. The method of claim 1 wherein said process consists of said etching step, a water rinse, a dip in an aqueous fluoboric acid solution and a step of plating in a tin/lead fluoborate bath.

5. A method as in claim 1 which comprises said etching step, a water rinse and plating in a tin/lead fluoborate bath.

* * * * *